(12) United States Patent
Kim et al.

(10) Patent No.: US 8,228,089 B2
(45) Date of Patent: Jul. 24, 2012

(54) WAFER TEST METHOD AND WAFER TEST APPARATUS

(75) Inventors: Youngok Kim, Suwon-si (KR); Jeongnam Han, Seoul (KR); Changki Hong, Seongnam-si (KR); Boun Yoon, Seoul (KR); Kuntack Lee, Suwon-si (KR); Young-Hoo Kim, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 357 days.

(21) Appl. No.: 12/704,206

(22) Filed: Feb. 11, 2010

(65) Prior Publication Data

US 2010/0200431 A1 Aug. 12, 2010

(30) Foreign Application Priority Data

Feb. 12, 2009 (KR) .................... 10-2009-0011526

(51) Int. Cl.
*G01R 31/26* (2006.01)
*G01R 31/08* (2006.01)
*H01L 21/66* (2006.01)

(52) U.S. Cl. ............... 324/762.05; 324/525; 438/17

(58) Field of Classification Search .......... 324/525, 324/512, 500, 762.01, 762.02, 762.03, 762.06, 324/762.05; 257/48, E21.521, E21.524; 438/14, 15, 17, 18, FOR. 100, FOR. 101
See application file for complete search history.

(56) References Cited

U.S. PATENT DOCUMENTS

| | | | |
|---|---|---|---|
| 4,479,088 A * | 10/1984 | Stopper | 324/525 |
| RE32,024 E * | 11/1985 | Greig | 324/754.04 |
| 5,943,548 A | 8/1999 | Kim | |
| 6,851,096 B2 * | 2/2005 | Alexander | 324/762.05 |
| 7,253,436 B2 * | 8/2007 | Matsumoto et al. | 257/48 |
| 2005/0258835 A1 * | 11/2005 | Saijyo et al. | 324/500 |
| 2007/0215044 A1 | 9/2007 | Yamazawa | |

FOREIGN PATENT DOCUMENTS

| | | |
|---|---|---|
| JP | 10-064968 | 6/1998 |
| JP | 2007-258239 | 4/2007 |
| KR | 100217325 | 6/1999 |
| KR | 1020040008415 | 1/2004 |
| KR | 1020070095241 | 9/2007 |

* cited by examiner

*Primary Examiner* — Hoai-An D Nguyen
(74) *Attorney, Agent, or Firm* — F. Chau & Associates, LLC

(57) ABSTRACT

The inventive concept provides a wafer test method and a wafer test apparatus. The wafer test method can recognize the amount of residuals generated in a sidewall of the metal-containing layer pattern and the extent of corrosion of a sidewall of the metal-containing layer pattern using the measured electric resistance by supplying an electrolyte so that the electrolyte is in contact with a portion of the metal-containing layer pattern in a predetermined chip region and measuring an electric resistance between a first electrode which is electrically in contact with the other portion of the metal-containing layer pattern and a second electrode which is in contact with the electrolyte in the predetermined region. Thus, a wafer test method and a wafer test apparatus can be embodied by an in-line method without dividing a wafer into each chip.

5 Claims, 11 Drawing Sheets

WAFER TEST METHOD AND WAFER TEST APPARATUS

CROSS-REFERENCE TO RELATED APPLICATIONS

This U.S. non-provisional patent application claims priority under 35 U.S.C. §119 to Korean Patent Application No. 10-2009-0011526, filed on Feb. 12, 2009, the entire disclosure of which is hereby incorporated by reference herein in it's entirety.

BACKGROUND OF THE INVENTIVE CONCEPT (i) Technical Field

The present disclosure herein relates to a wafer test method and a wafer test apparatus.

(ii) Description of the Related Art

Residual products may be generated during semiconductor manufacturing processes, and in particular, during an etching process. When an etching process to form a metal interconnection is performed, nitride layer components on the metal interconnection, an etching gas and metal interconnection components are combined with one another, so that residual products of high molecular type may be generated on a sidewall of the metal interconnection or the metal interconnection may be corroded. Whether residual products exist on a sidewall of the metal interconnection, or the metal interconnection is corroded or not can be visibly verified using, for example, a SEM (scanning electron microscope) or a TEM (Transmission Electron Microscopy). However, it may be difficult to make a quantification of how far the residual products exist or the metal interconnection is corroded in one chip. Also, conventional test methods for monitoring a process degree of a wafer are typically performed using a chip obtained by cutting it into pieces, and thus these processes may be cumbersome.

SUMMARY OF THE INVENTIVE CONCEPT

Embodiments of the inventive concept provide wafer test methods. The methods include: preparing a wafer including a chip region on which a metal-containing layer pattern having a first portion and a second portion is formed, supplying an electrolyte so that the electrolyte is in contact with the first portion of the metal-containing layer pattern in the chip region and measuring an electrical resistance between a first electrode electrically connected to the second portion of the metal-containing layer pattern in the chip region and a second electrode which is in contact with the electrolyte.

Before supplying the electrolyte, the method may further include forming a conductive layer which is in contact with the second portion of the metal-containing layer pattern, wherein the first electrode is in contact with the conductive layer.

The forming of the conductive layer may include: coating a conductive adhesive so that the conductive adhesive is in contact with the metal-containing layer pattern; and drying the conductive adhesive to form the conductive layer.

The electric resistance may be represented as an impedance of a complex number.

An area which the electrolyte occupies in the chip region may be constant regardless of a position of the chip region.

Embodiments of the inventive concept provide wafer test apparatuses which include: a wafer receiving portion in which a wafer is received, wherein the wafer includes a plurality of chip regions on which a metal-containing layer pattern is formed. The wafer test apparatuses further include a first electrode electrically connected to a first portion of the metal-containing layer pattern, an electrolyte supply unit supplying an electrolyte which is in contact with a second portion of the metal-containing layer pattern in a region on a wafer, a second electrode which is in contact with the electrolyte and a potentiostat which applies a constant current and a constant voltage to the first electrode and the second electrode to measure an electric resistance.

The wafer test apparatus may further include: an adhesive supply unit coating a conductive adhesive on the first portion of the metal-containing layer pattern; and a drying chamber which dries the conductive adhesive.

The wafer may further include an insulating pattern formed on the metal-containing layer pattern, and the first electrode may have a sharp end portion and penetrate the insulating pattern to be in contact with the metal-containing layer pattern.

The electrolyte supply unit may include: an electrolyte supply external pipe having an upper portion and a lower portion whose width is narrower than a width of the upper portion, an internal minute pipe disposed inside the electrolyte supply external pipe and a buffer ring disposed on the lower portion of the electrolyte supply external pipe, and wherein the first electrode may be adjacent to an outside of the electrolyte supply external pipe and electrically insulated from the electrolyte supply external pipe, and the second electrode may be disposed inside the electrolyte supply external pipe.

An end portion of the internal minute pipe may be disposed to be adjacent to the lower portion of the electrolyte supply external pipe.

In another exemplary embodiment of the inventive concept, a wafer test apparatus is provided. The wafer test apparatus includes a wafer receiving portion in which a wafer is received, wherein the wafer includes a plurality of chip regions on which a metal-containing layer pattern is formed, an electrolyte supply unit supplying an electrolyte which is in contact with a first portion of the metal-containing layer pattern in a region of the wafer. The electrolyte supply unit includes an electrolyte tank containing the electrolyte, an electrolyte supply external pipe connected to a lower portion of the electrolyte tank and an internal minute pipe disposed inside the electrolyte supply external pipe for supplying the electrolyte, and wherein a low portion of the internal minute pipe is disposed to be adjacent to the lower portion of the electrolyte supply external pipe. The wafer test apparatus further includes a buffer ring combined with the lower portion of the electrolyte supply external pipe, a location recognition portion disposed on one side of the electrolyte supply unit for recognizing the chip regions of the wafer and a pressure sensor disposed on a predetermined region of the lower portion of the electrolyte supply external pipe to measure a pressure which is put on the wafer. In addition, the wafer test apparatus further includes a first electrode combined with a lower end of the outside of the electrolyte supply external pipe by a combination means and electrically connected to a second portion of the metal-containing layer pattern, a second electrode disposed on a predetermined region between the electrolyte supply external pipe and the internal minute pipe and in contact with the electrolyte, a third electrode spaced apart from the second electrode and disposed on another region than the first electrode and the second electrode between the electrolyte supply external pipe and the internal minute pipe and a potentiostat for measuring an electrical resistance between the first electrode and the second electrode. The first electrode, the second electrode and the third electrode are each connected to the potentiostat, and wherein the potentiostat is adapted to apply a regular voltage and a regular current to the first electrode and the second electrode, respectively.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Figure 1:
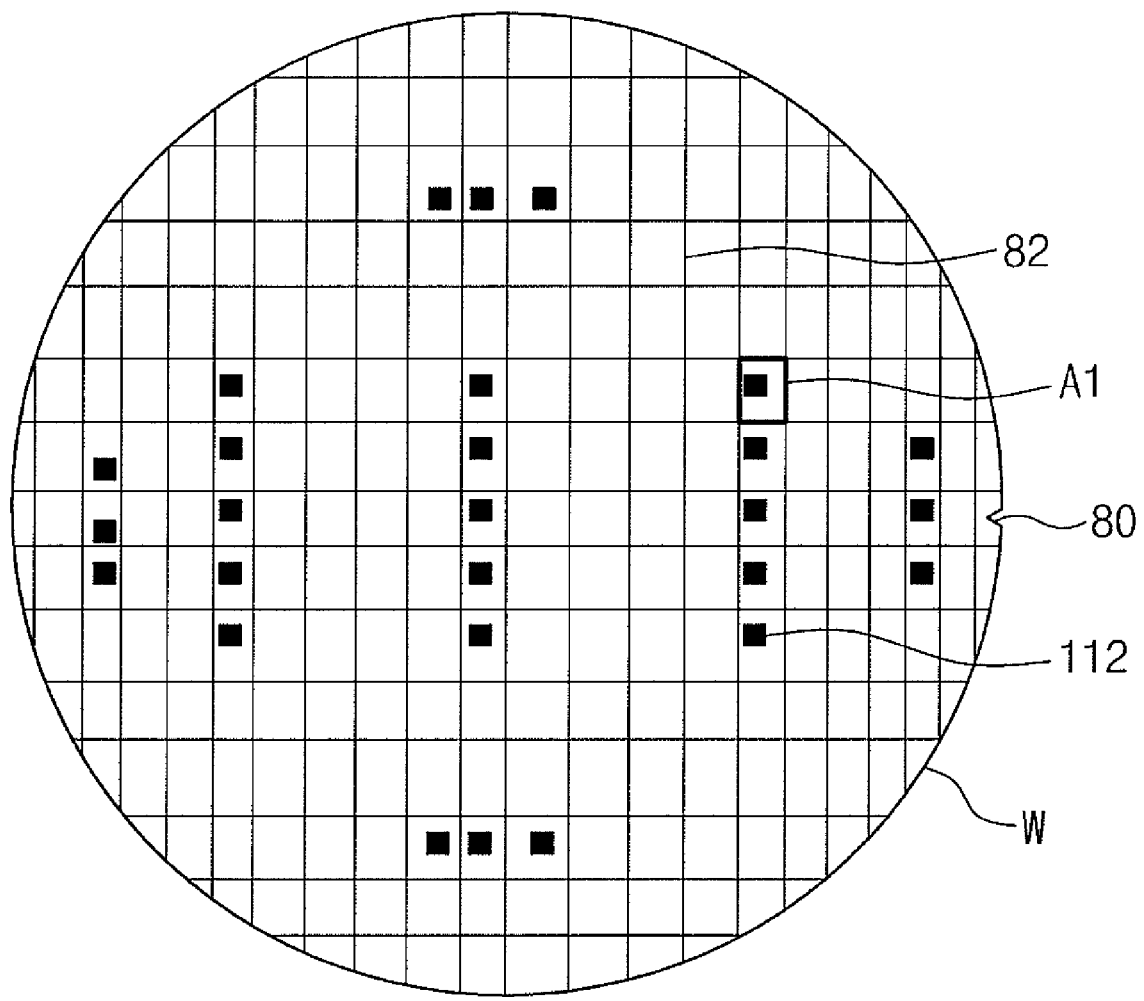
FIG. 1 is a view of a wafer used in a wafer testing method or a wafer test apparatus in accordance with an exemplary embodiment of the present inventive concept.

Preferred embodiments of the inventive concept will be described below in more detail with reference to the accompanying drawings. The embodiments of the inventive concept may, however, be embodied in different forms and should not be constructed as limited to the embodiments set forth herein. Like numbers refer to like elements throughout.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present.

A wafer test method in accordance with an embodiment of the inventive concept comprises preparing a wafer including a plurality of chip regions in which a metal-containing layer pattern is formed (step 1), providing an electrolyte so that the electrolyte is in contact with a portion of the metal-containing layer pattern at the predetermined chip region (step 2) and measuring an electric resistance between a first electrode which is electrically in contact with the other portion of the metal-containing layer pattern and a second electrode which is in contact with the electrolyte in the predetermined chip region (step 3). Those processes will be described in further detail below.

(Step 1: Preparing a Wafer Including a Plurality of Chip Regions in which a Metal-Containing Layer Pattern is Formed)

Figure 2:
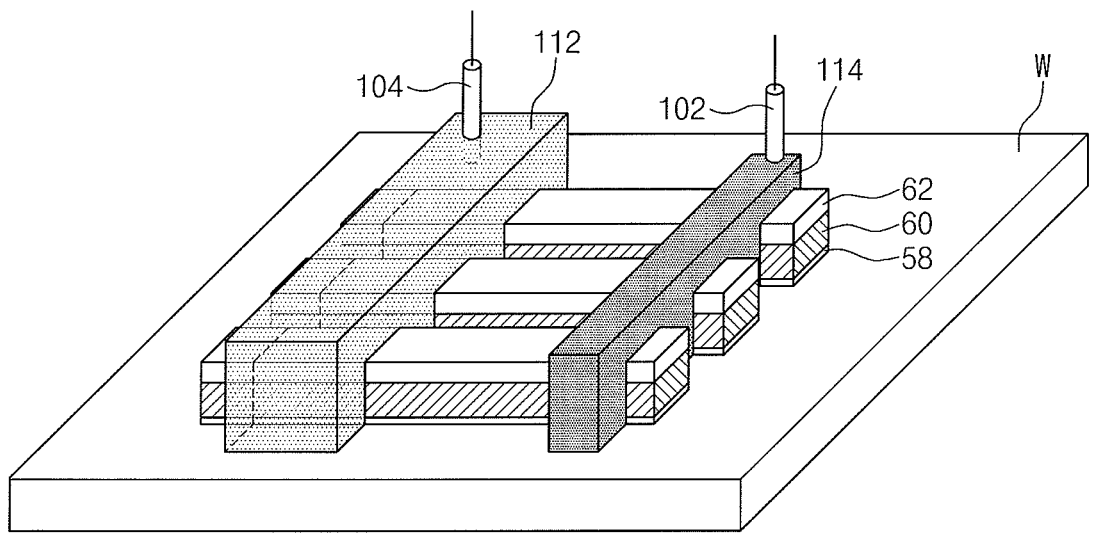
FIG. 2 is a perspective view illustrating a wafer test method in accordance with an exemplary embodiment of the inventive concept, which enlarges a chip region corresponding to A1 of FIG. 1.

First, a wafer (W) of FIG. 1 is prepared. Referring to FIG. 1, a notch region 80 which can check a location and a plurality of chip regions 82 are formed on the wafer (W). A metal-containing layer pattern 60 is formed on each of the chip regions 82 as shown in FIG. 2. Insulating patterns 58 and 62 may be disposed under and on the metal-containing layer pattern 60 respectively. That is, after an insulating layer, a metal-containing layer and an insulating layer are sequentially stacked, the wafer (W) may include the insulating patterns 58 and 62 and the metal-containing layer pattern 60 formed by sequentially etching the insulating layer, the metal-containing layer and the insulating layer. The metal-containing layer pattern 60 may be a gate electrode line or a metal interconnection. For example, the metal-containing layer pattern 60 may be metal such as aluminum, copper, tungsten and titanium or may be a conductive metal-containing layer containing aluminum, copper, tungsten and titanium. The metal-containing layer pattern 60 may include, for example, a polysilicon layer which is doped with an impurity or not and a metal-containing layer which is stacked on the polysilicon layer. If the metal-containing layer pattern 60 is a gate electrode line, the insulating pattern 58 may be a gate insulating layer. In the present step, which chip region among the plurality of chip regions 82 is tested may be determined. For example, as shown in FIG. 1, the chip regions 82 to which an electrolyte 112 is provided may be selected.

(Step 2: Providing an Electrolyte so that the Electrolyte is in Contact with a Portion of the Metal-Containing Layer Pattern at the Predetermined Chip Region)

In the present step, the electrolyte 112 is provided so that the electrolyte is in contact with a portion of the metal-containing layer pattern 60 at one chip region among the chip regions selected in the step 1. For example, in FIG. 2 which enlarges the chip region 82 corresponding to A1 of FIG. 1, the electrolyte 112 is provided to be simultaneously in contact with portions of the metal-containing layer patterns 60 of a line type parallel to one another. That is, portions of the metal containing patterns 60 are wet by the electrolyte 112. However, the electrolyte 112 is located at a specific region and does not flow out by an additional means. It is desirable that an area which the electrolyte 112 takes up in one chip is uniform regardless of a chip location. The electrolyte 112 may mean a solution including an electrolyte which can be dissociated into ions. The electrolyte 112 may be, for example, at least one selected from a group consisting of sodium sulfate ($Na_2SO_4$) water solution, potassium hexacyanoferrate ($KFe_2(CN)_6$) water solution and chromium nitrate ($Cr(NO_3)_3$) water solution.

(Step 3: Measuring an Electric Resistance Between a First Electrode which is Electrically in Contact with the Other Portion of the Metal-Containing Layer Pattern and a Second Electrode which is in Contact with the Electrolyte in the Predetermined Chip Region)

In the present step, after providing an electrolyte in the former step, a first electrode which is electrically in contact with the other portion of the metal-containing layer pattern and a second electrode which is in contact with the electrolyte are prepared and then an electric resistance between the first electrode and the second electrode is measured. Before providing an electrolyte of the step 2, an additional action may be adopted so that the first electrode is electrically in contact with the other portion of the metal-containing layer pattern to perform the present step. For example, before providing an electrolyte, a conductive layer which is in contact with the other portion of the metal-containing layer pattern may be formed. After providing an electrolyte, the first electrode may be in contact with the conductive layer. An insulating pattern for the purpose of an etching mask or a capping layer may be formed on a metal interconnection and a gate electrode line formed during a semiconductor manufacturing process. Even if an insulating pattern is not formed, it may be difficult for the first electrode to be precisely in contact with a metal interconnection or a gate electrode because the metal interconnection or the gate line may be very minute. Accordingly, it may be rather easy after widely forming a conductive layer which is in contact with a plurality of metal interconnections and gate electrode lines in common for the first electrode to be in contact with the conductive layer.

Referring to FIG. 2, a conductive layer 114 which crosses the other portions of the metal containing patterns 60 and is in contact with the other portions in common is formed. A conductive adhesive is pasted so that the conductive layer 114 is in contact with the other portions (e.g., sidewalls) of the metal containing patterns 60 and is thermally or naturally dried to form the conductive layer 114. For example, carbon paste or silver paste may be used as the conductive adhesive and the drying process may be performed for about 1 to about 12 minutes at a temperature of about 90 to about 110° C. It is desirable that the conductive adhesive is not contact with the electrolyte 112 so that unwanted residuals by a reaction between the electrolyte 112 and the conductive adhesive are not generated. After forming the conductive layer 114, a first electrode 102 which is in contact with the first conductive layer 114 and a second electrode 104 which is in contact with the electrolyte 112 are prepared. A specific voltage and a specific current are applied to the first electrode 102 and the second electrode 104 respectively to measure an electric resistance between the first electrode 102 and the second electrode 104. The electric resistance may be represented as an impedance of a complex number type. The method of measuring an electric resistance may be, for example, an electrochemical impedance spectroscopy (EIS) method or Tafel method.

Figure 4:
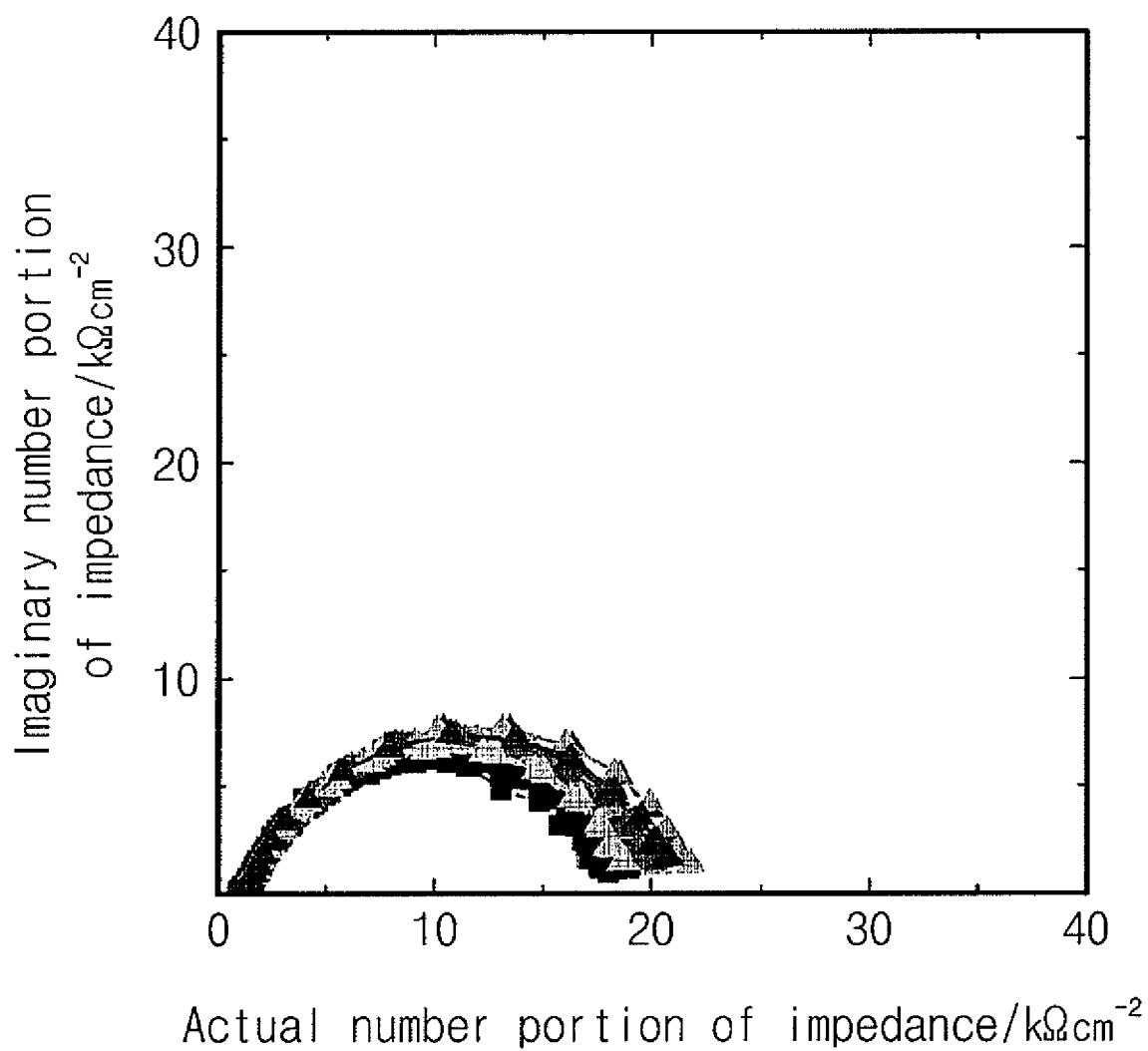
FIG. 4 is a graph representing results of electric resistance measured in the chip regions selected from the wafer of FIG. 1.

FIG. 4 is a graph representing electric resistances measured in the chip regions selected from the wafer of FIG. 1 on which a metal interconnection (or gate electrode line) process is completed as an impedance of a complex number type. In this case, a wafer on which a gate electrode pattern containing a tungsten layer is formed and a cleaning process is performed is prepared. After forming a conductive layer on chip regions of the wafer using carbon paste, an electrolyte including chromium nitrate ($Cr(NO_3)_3$) was provided, and then an electric resistance between the first electrode and the second electrode was measured. At this time, after applying about −0.7V to the first electrode and applying 0V to the second electrode, an electric resistance was measured. In FIG. 4, several similar dot lines overlap one another at the same position. One dot line represents an electric resistance in one chip region. Thus, electric resistances measured in various chip regions of one wafer are almost uniform regardless of positions of chip regions (in FIG. 4, the electric resistance is real impedance of an x axis and is about 18-20 $k\Omega/cm^2$).

Accordingly, in a wafer in which one unit process is completed, an electric resistance may have reproducibility regardless of chip regions.

Figure 3:
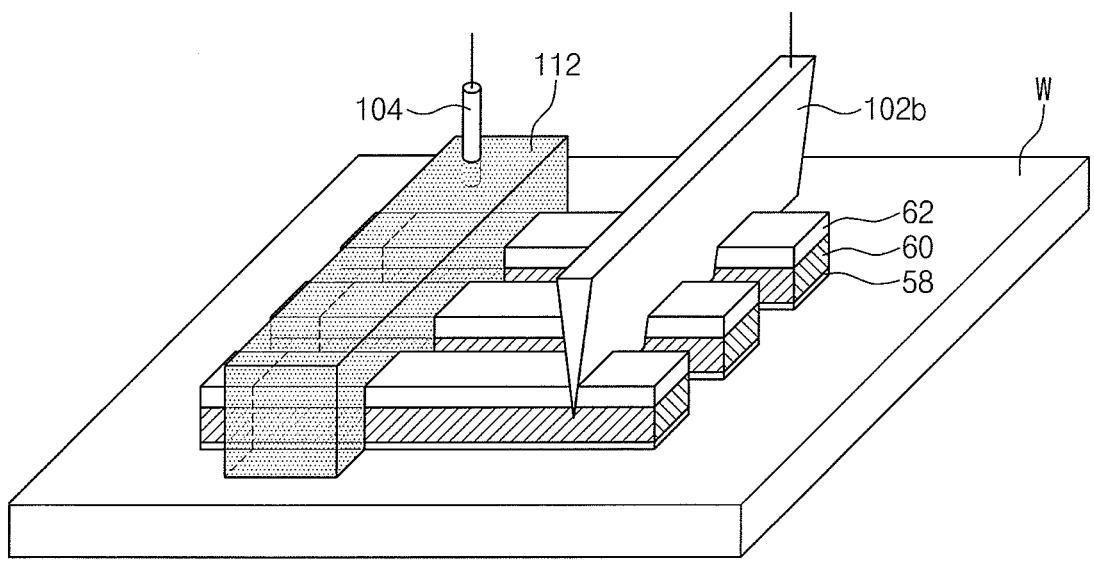
FIG. 3 is a perspective view illustrating a wafer test method in accordance with an exemplary embodiment of the inventive concept.

In a modified embodiment of FIG. 3, the conductive layer 114 is not formed and a first electrode 102b has a sharp end portion. That is, as the first electrode 102b has a shape of an edge of a knife, it penetrates an insulating pattern 62 on the metal-containing layer pattern 60 to be in contact with a top surface of the metal containing pattern 60.

The first electrode 102b has the same shape as the first electrode 102 of FIG. 2. A conductive rod of a shape of an edge of a knife having a sharp end portion penetrates the insulating pattern 62 on the metal-containing layer pattern 60 to be in contact with the top surface of the metal-containing layer pattern 60. The first electrode 102 of a general type may be in contact with the conductive rod of the shape of an edge of a knife.

The amount of residuals generated in a sidewall of the metal-containing layer pattern and the extent of corrosion of a sidewall of the metal-containing layer pattern may become a fixed quantity as an electric resistance through those processes described above.

In addition, after preparing wafers having various process conditions and measuring electric resistances using the wafer test method described above, basic data including electric resistances in accordance with process conditions may be established. For example, after forming the metal-containing layer pattern and preparing various sample wafers such as a wafer in which a cleaning process has not been performed, a wafer in which a cleaning process has been performed for about 60 seconds and a wafer in which a cleaning process has been performed for about 120 seconds, the electric resistance is subsequently measured in each wafer using the wafer test method described above. At this time, residuals existing on a sidewall of the metal-containing layer pattern can be visibly verified using, for example, SEM or TEM. Basic data is prepared using the electric resistances. The amount of residuals generated in a sidewall of the metal-containing layer pattern and the extent of corrosion of a sidewall of the metal-containing layer pattern can be estimated by comparing electric resistances measured in a wafer including a metal-containing layer pattern formed by a predetermined process using the wafer test method described above with the basic data which has already been prepared.

Figure 5A:
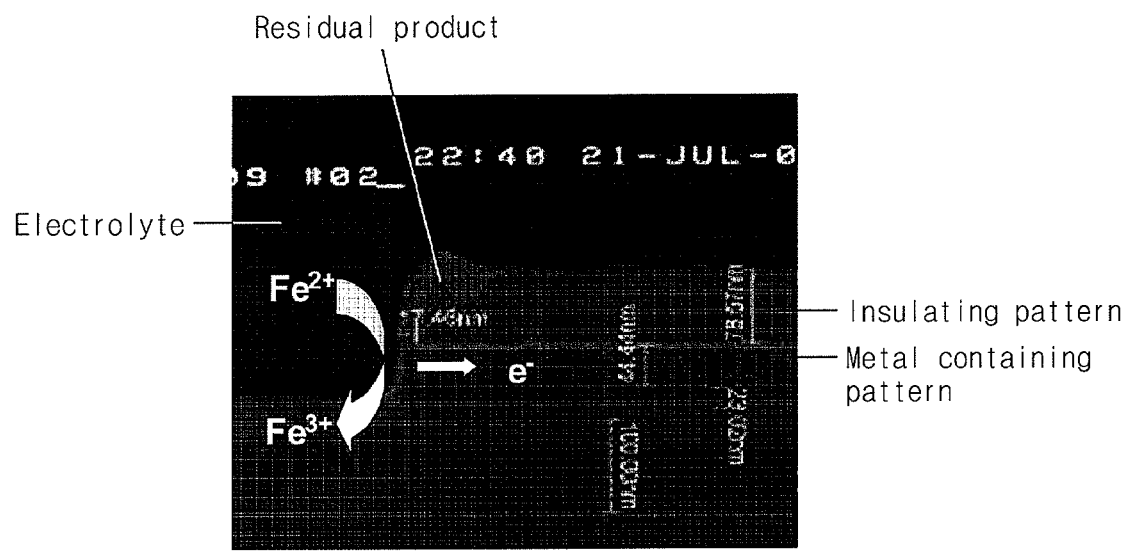
FIGS. 5A and 5B are TEM (Transmission Electron Microscopy) photographs of a substrate on which a metal-containing layer pattern is formed before or after performing a cleaning process respectively.
Figure 5B:
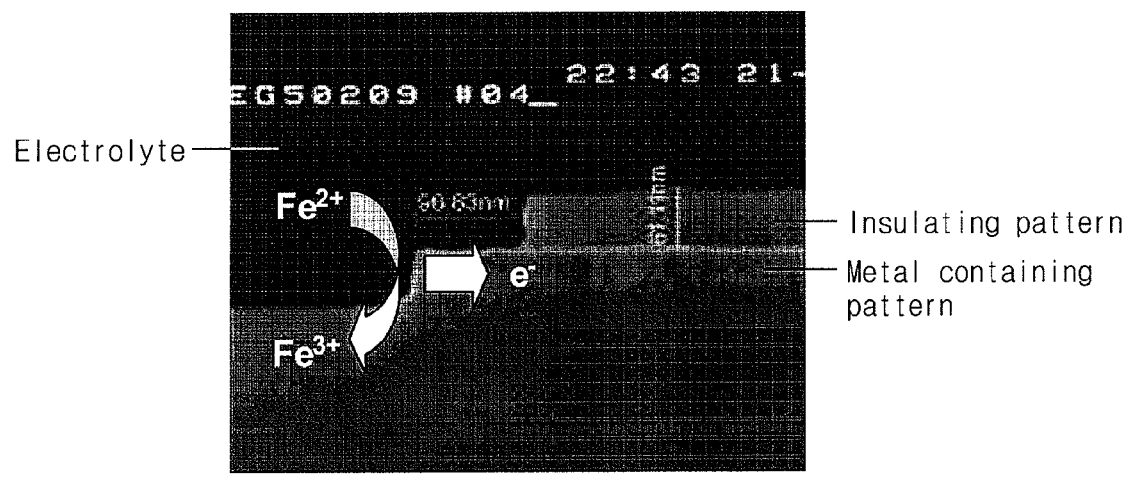
Figure 6:
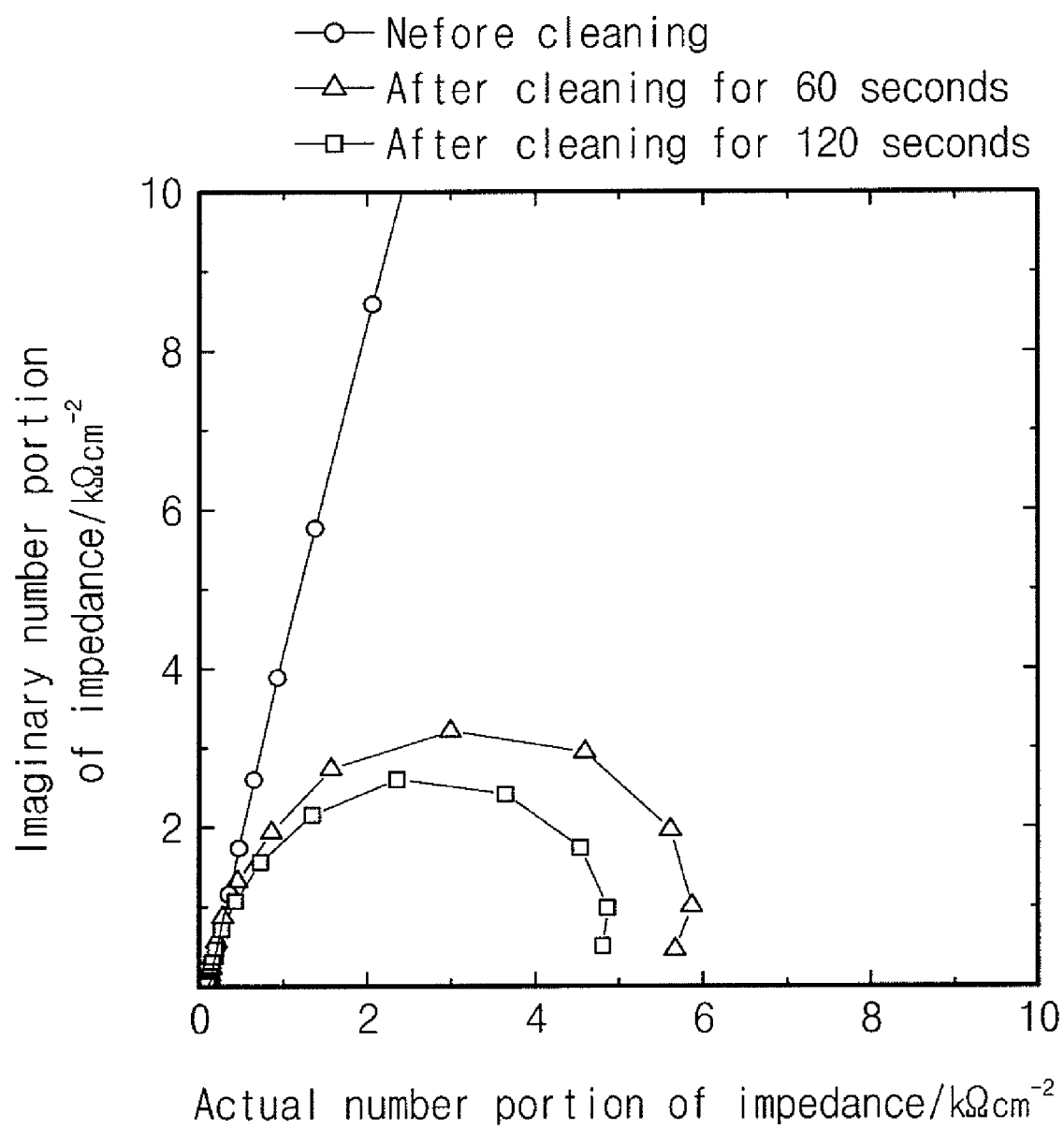
FIG. 6 is a graph representing an electric resistance in accordance with whether a cleaning process is performed or not and how far a cleaning process is performed.

Those will be described in detail with reference to FIGS. 5A, 5B and 6. FIGS. 5A and 5B are TEM (Transmission Electron Microscopy) photographs of a substrate on which a metal-containing layer pattern is formed before or after performing a cleaning process respectively. FIG. 6 is a graph representing an electric resistance in accordance with whether a cleaning process is performed or not and how far a cleaning process is performed.

Referring to FIG. 5A, before a cleaning process is performed, an etching residual exists on a sidewall of a metal-containing layer pattern. Thus, an oxidation reaction or a reduction reaction by ions dissociated in an electrolyte may not smoothly occur in the sidewall of the metal-containing layer pattern. That is, as a side surface of the metal-containing layer pattern exposed to an electrolyte becomes relatively narrow by a sidewall residual, an oxidation reaction, for example, $Fe^{2+}-e^-\rightarrow Fe^{3+}$ may not smoothly occur in the side surface of the exposed metal-containing layer pattern. That is, the number of electrons (e) transferring to the metal-containing layer pattern through the side surface of the exposed metal-containing layer pattern may be relatively few. As a result, the electric resistance may be relatively great.

Referring to FIG. 5B, an etching residual does not exist on a sidewall of the metal-containing layer pattern after a cleaning process is performed. In FIG. 5B, a cleaning process is excessively performed, so a portion of an insulating pattern on the metal-containing layer pattern is removed. As an etching residual does not exist, an area of the metal-containing layer pattern exposed to an electrolyte becomes wide, so an oxidation reaction or a reduction reaction by ions dissociated in an electrolyte may smoothly occur. That is, the number of electrons (e) transferring to the metal-containing layer pattern through the side surface of the exposed metal-containing layer pattern is relatively numerous. As a result, the electric resistance may be relatively small.

As described in FIGS. 5A and 5B, the amount of etching residuals existing on a sidewall of the metal-containing layer pattern becomes different according to whether a cleaning process is performed or not and how far a cleaning process is performed, so the electric resistance may become different.

Referring to FIG. 6, an electric resistance was too great to represent an actual number of impedance on a graph before cleaning process is performed. However, the electric resistance had an actual number of impedance of about 6 $\Omega/cm^2$ when a cleaning process was performed for about 60 seconds and had an actual number of impedance of about 5 $\Omega/cm^2$ when a cleaning process was performed for about 120 seconds. Thus, the more a cleaning process is performed, the smaller the actual number of impedance may become. That is, the electric resistance may become small. Basic data may be prepared by performing the experiments described above. The amount of residuals generated in a sidewall of the metal-containing layer pattern and the extent of corrosion of a sidewall of the metal-containing layer pattern can be estimated by comparing electric resistances measured in a wafer including a metal-containing layer pattern formed by a predetermined process using the wafer test method described above with the basic data which has already been prepared.

A wafer test method which can quantify the amount of residuals or the extent of corrosion can be embodied without dividing a wafer into each chip through the processes described above.

Figure 7:
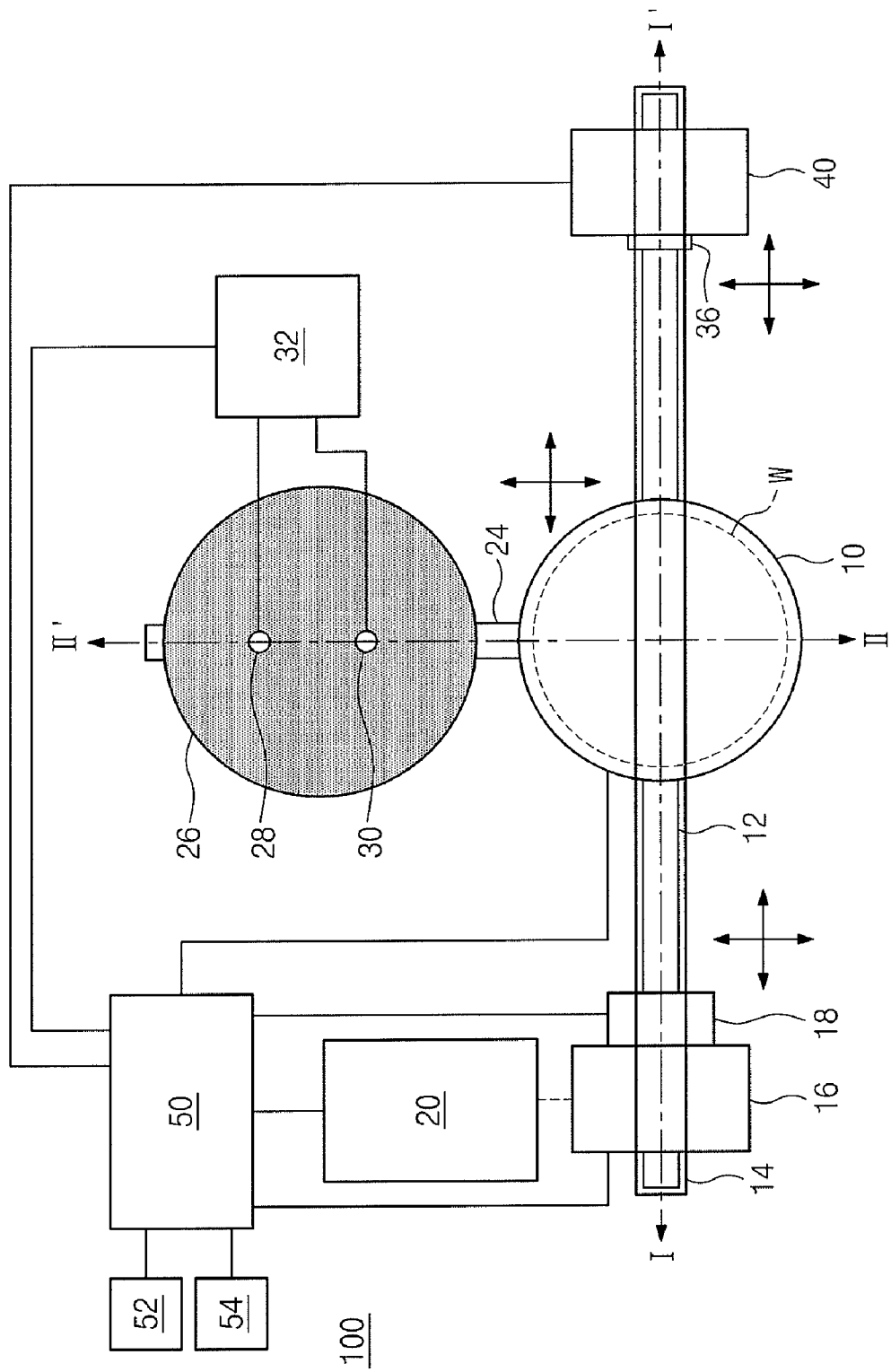
FIG. 7 is a top plan view illustrating a wafer test apparatus in accordance with an exemplary embodiment of the inventive concept.
Figure 8:
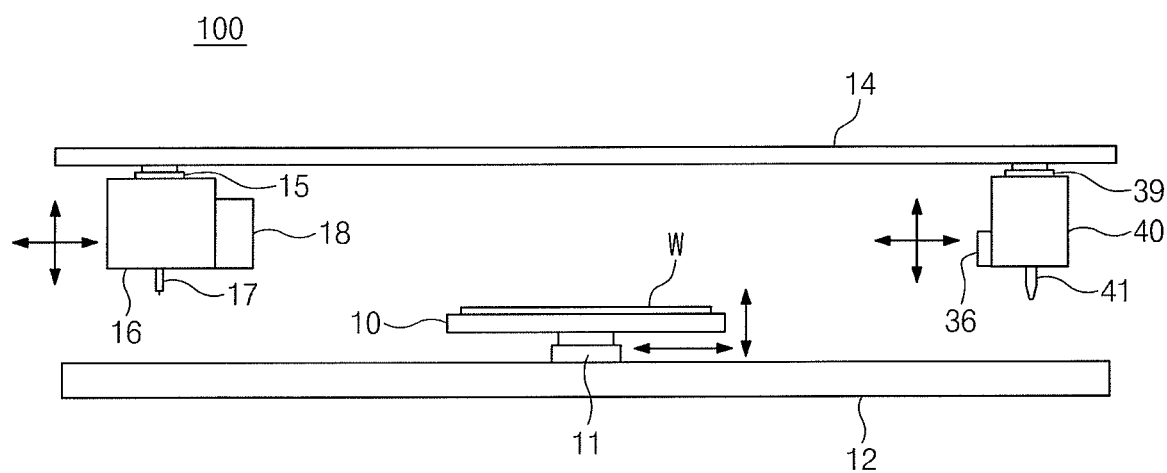
FIG. 8 is a cross section view taken along the line I-I' of FIG. 7.
Figure 9:
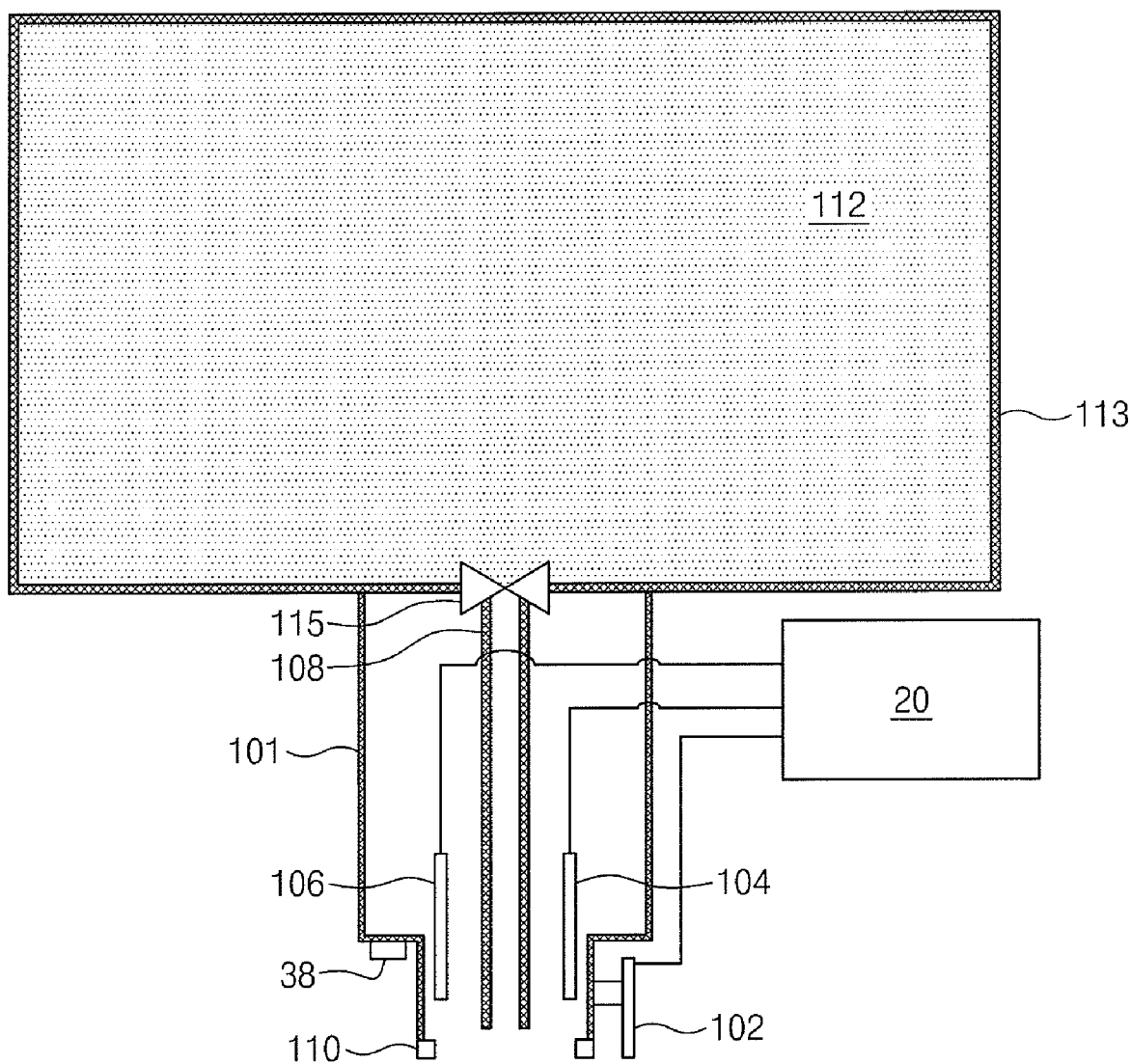
FIG. 9 is a cross section view of an electrolyte supply unit of FIG. 8.
Figure 10:
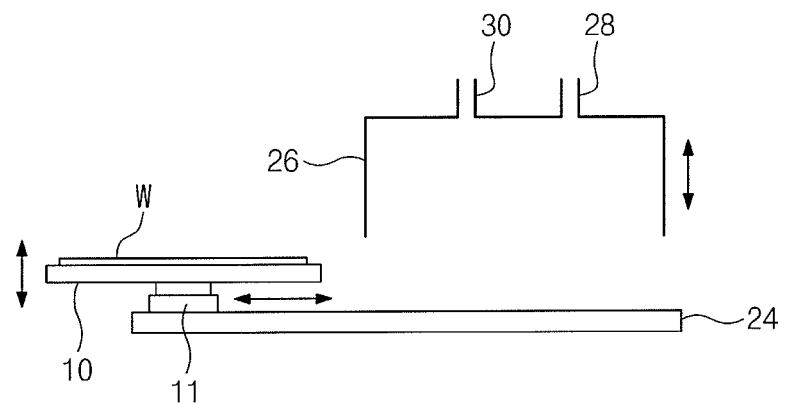
FIG. 10 is a cross section view taken along the line II-II' of FIG. 7.

FIG. 7 is a top plan view illustrating a wafer test apparatus in accordance with an embodiment of the inventive concept. FIG. 8 is a cross section view taken along the line I-I' of FIG. 7. FIG. 9 is a cross section view of an electrolyte supply unit of FIG. 8. FIG. 10 is a cross section view taken along the line II-II' of FIG. 7.

Referring to FIGS. 7, 8 and 10, a wafer test apparatus 100 in accordance with an embodiment of the inventive concept includes a wafer receiving portion 10 in which a wafer (W) including a plurality of chip regions 82 on which a metal-containing layer pattern 60 is formed is received as shown in FIGS. 1 and 2. The wafer receiving portion 10 may move from side to side and from front to rear along a lower right and left guide rail 12 and a lower front and rear guide rail 24. Also, the wafer receiving portion 10 move up and down by a lifting actuator 11 located under the wafer receiving portion 10. An upper right and left guide rail 14 is disposed on the lower right and left guide rail 12. An electrolyte supply unit 16 is combined with one end of the upper right and left guide rail 14 to move from side to side along the upper right and left guide rail 14. The electrolyte supply unit 16 may move from front to rear through a means such as other guide rail which is not depicted. The electrolyte supply unit 16 may move up and down by a lifting actuator 15. The electrolyte supply unit 16 is a unit apparatus supplying an electrolyte. An adhesion supply unit 40 is combined with other end portion of the upper right and left guide rail 14 to move from side to side along the upper right and left guide rail 14. The adhesion supply unit 40 may move from front to rear through a means such as other guide rail which is not depicted. The adhesive supply unit 40 may move up and down by a lifting actuator 39. The adhesive supply unit 40 is a unit apparatus supplying an adhesive. The adhesive supply unit 40 may include, for example, an adhesive tank in which an adhesive is stored and an adhesive nozzle 41 connected to a lower portion of the adhesive supply unit 40.

Referring to FIGS. 7, 8 and 10, a drying chamber 26 is disposed on a portion of the lower front and rear guide rail 24. The drying chamber 26 is a chamber drying the adhesion and includes gas supply pipes 28 and 30 supplying a gas of high temperature and a gas of low temperature respectively. Gas supplies of the gas supply pipes 28 and 30 are controlled by a gas supply control apparatus 32. A location recognition portion 18 such as, for example, a charge-coupled device (CCD) camera may be disposed on one side of the electrolyte supply unit 16. A height sensor 36 may be disposed on one side of the adhesive supply unit 40.

Referring to FIGS. 7, 8 and 9, the electrolyte supply unit 16 includes an electrolyte tank 113 containing an electrolyte 112 and an electrolyte supply external pipe 101 connected to a lower portion of the electrolyte tank 113. The width of a lower portion of the electrolyte supply external pipe 101 is smaller than the width of an upper portion of the electrolyte supply external pipe 101. The width of a lower portion of the electrolyte supply external pipe 101 may be smaller than the size of one chip region of a wafer. An internal minute pipe 108 is disposed inside the electrolyte supply external pipe 101. The electrolyte 112 may be supplied through the internal minute pipe 108. A low portion of the internal minute pipe 108 is disposed to be adjacent to the lower portion of the electrolyte supply external pipe 101. Thus, when an electrolyte 112 is supplied through the internal minute pipe 108, the electrolyte 112 may fill the electrolyte tank 113 well without a bubble. A valve 115 exists between the internal minute pipe 108 and the electrolyte tank 113 to control a supply of the electrolyte 112. Alternatively, the valve 115 does not exist between the internal minute pipe 108 and the electrolyte tank 113 and a pump which can apply a negative pressure and a positive pressure may be connected to a predetermined position of the electrolyte tank 113. A supply of the electrolyte 112 can be controlled by operating the pump. A buffer ring 110 is combined with the lower portion of the electrolyte supply external pipe 101. The buffer ring 110 may be formed of material such as, for example, silicon rubber having soft and tender characteristics. The buffer ring 110 eases a pressure when the electrolyte supply external pipe 101 is disposed on one chip region 82 of the wafer (W) to press the wafer (W) during the subsequent process. Also, the buffer ring 110 forms a sealed region so that the electrolyte 112 flows in only the designated region. Thus, the electrolyte may be supplied so as to occupy only a fixed area of the chip region 82 by the buffer ring 110, thereby providing a standard when an electric resistance is measured. A pressure sensor 38 is disposed on a predetermined region of a lower portion of the electrolyte supply external pipe 101 to measure a pressure which is put on the wafer (W).

Referring to FIGS. 7, 8 and 9, a first electrode 102 may be disposed to be combined with a lower end of the outside of the electrolyte supply external pipe 101 by combination means. A second electrode 104 may be disposed on a predetermined region between the electrolyte supply external pipe 101 and the internal minute pipe 108. A third electrode 106 spaced apart from the second electrode 104 may be disposed on the other region between the electrolyte supply external pipe 101 and the internal minute pipe 108. The electrodes 102, 104 and 106 may be connected to potentiostat 20. The potentiostat 20 can apply a regular voltage and a regular current to the first and second electrodes 102 and 104 respectively. For example, a voltage of about 2V may be applied to the first electrode 102 and a voltage of 0V may be applied to the second electrode 104. No voltage may be applied to the third electrode 106. The potentiostat 20 may measure an electric resistance between the first electrode 102 and the second electrode 104 as impedance of a complex number type. The third electrode 106 may be used so that a reaction opposite to the oxidation reaction or the reduction reaction which may occur in the second electrode 104 occurs. That is, for example, when an oxidation reaction occurs in the second electrode 104, a reduction reaction may occur in the third electrode 106.

Referring to FIGS. 7 through 10, voltage and current applied from the potentiostat 20, an electric resistance to be measured, a supply speed of an electrolyte in the electrolyte supply unit 16, the sensors 36 and 38 and the gas supply control apparatus 32 are controlled by, for example, a central processing unit (CPU) 50. The CPU 50 may be connected to a displayer 52 outputting the electric resistance, the value measured by the sensors 36 and 38 and a gas temperature. The displayer 52 may, for example, be a monitor. The CPU 50 may also be connected to an input portion 54 inputting a gas temperature, the amount of electrolyte supply, the amount of adhesive supply and a location of a chip region to measure an electric resistance. The input portion 54 may, for example, be a keyboard.

Next, an operation process of the wafer test apparatus 100 will be described. FIGS. 11 through 14 are cross section views sequentially illustrating an operation order of a wafer test apparatus in accordance with an embodiment of the inventive concept.

Figure 11:
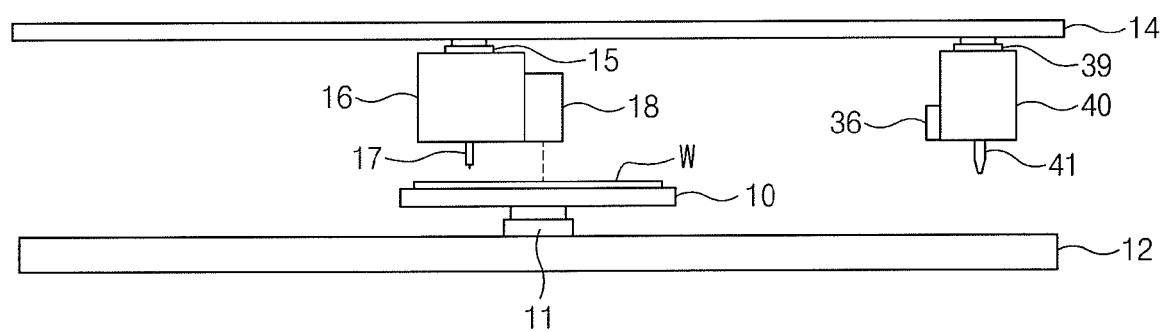
FIGS. 11 through 14 are cross section views sequentially illustrating an operation order of a wafer test apparatus in accordance with an exemplary embodiment of the inventive concept.

Referring to FIG. 11, first, a wafer (W) on which a metal-containing layer pattern 60 is formed is loaded on a wafer receiving portion 10. Chip regions 82 of which electric resistances are to be measured are selected and the measured electric resistances are inputted through the input portion 54. The location recognition portion 18 moves onto the wafer (W) along the upper right and left guide rail 14 by the inputted location value to recognize the notch 80 and recognize locations of the chip regions 82 based on the notch 80. The location data is stored in the CPU 50 again. After the location recognition portion 18 recognizes locations of the chip regions, the height sensor 36 combined with one side of the electrolyte supply unit 40 moves onto the wafer (W) and the height sensor 36 detects the height of a surface of the wafer (W). The height data is stored in the CPU 50.

Figure 12:
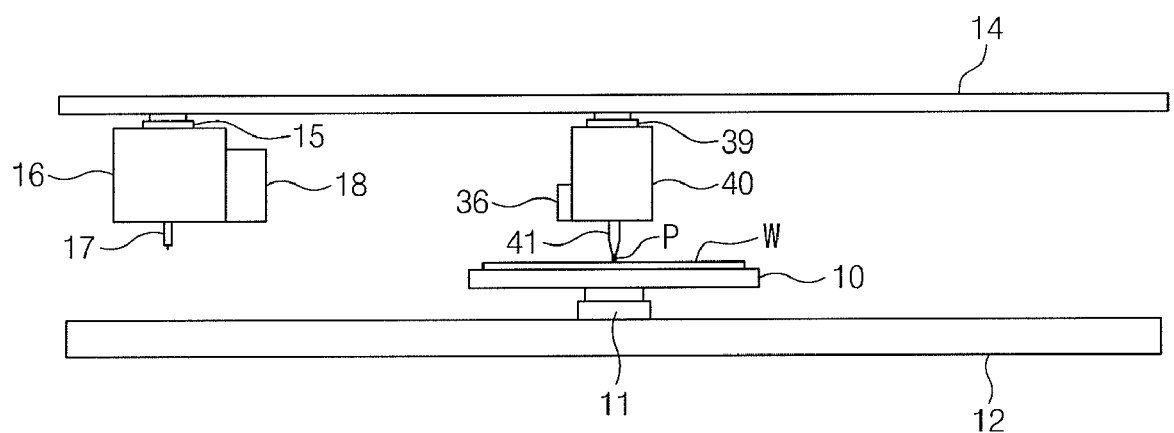

Referring to FIG. 12, the adhesive supply unit 40 moves onto the wafer (W) based on the height data and the location data stored in the CPU 50 and supplies a conductive adhesive (P) to coat a portion of selected chip region of the wafer (W). The conductive adhesive (P) may be, for example, a carbon paste or a silver paste.

Figure 13:
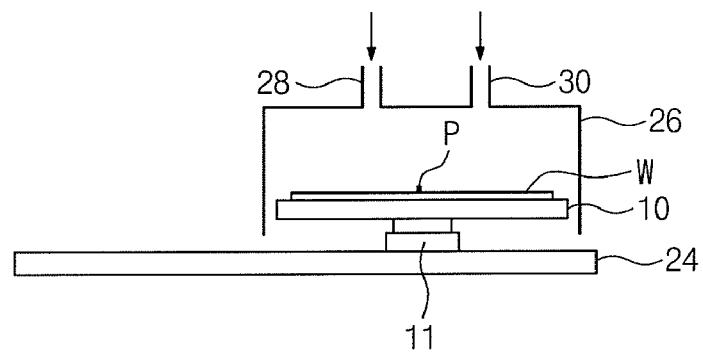

Referring to FIG. 13, the wafer receiving portion 10 moves along the lower front and rear guide rail 24 to be disposed under the drying chamber 26. The drying chamber 26 moves down to cover the wafer receiving portion 10 and hot air is supplied through one of the gas pipes 28 and 30 to rapidly dry the conductive adhesive (P). For example, the hot air may be supplied for about 10 minutes at a temperature of about 100° C. Subsequently, a process cooling the wafer (W) may be performed. Air of room temperature or air of a temperature lower than a room temperature may be supplied through the other of the gas pipes 28 and 30 to cool the wafer (W). If a dry of the conductive adhesive (P) is finished, the conductive layer 114 is formed as shown in FIG. 2.

Figure 14:
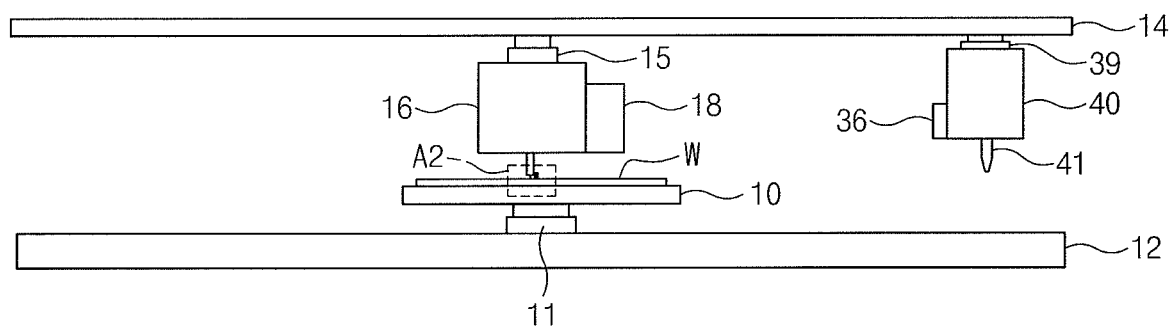
Figure 15:
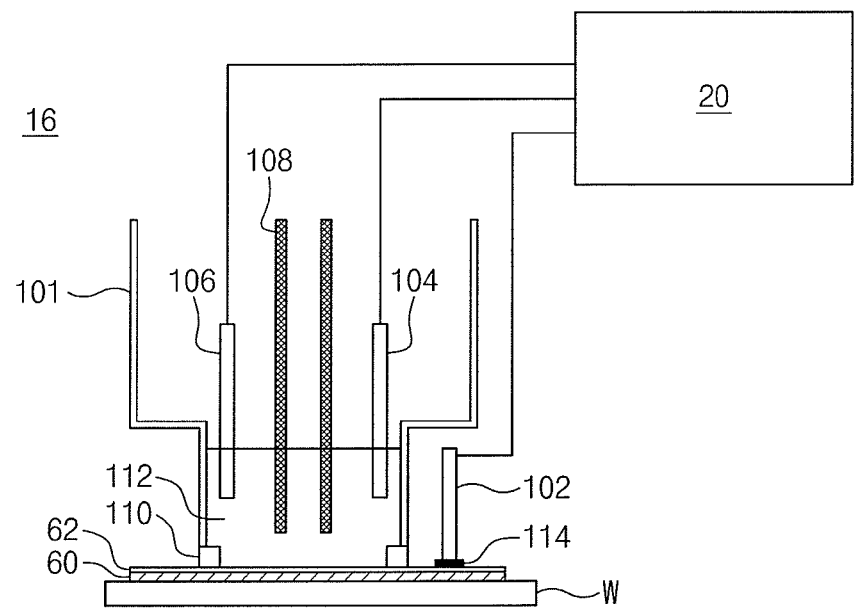
FIG. 15 is an enlarged view of A2 region of FIG. 14.

Referring to FIGS. 14 and 15, when the dry process is finished, the dry chamber 26 moves up again and the wafer receiving portion 10 moves to the center of the lower right and left guide rail 12. The electrolyte supply unit 16 moves onto the wafer (W) by the location data and the height data stored in the CPU 50 and the electrolyte supply external pipe 101 is placed on the selected chip region. At this time, the pressure pressed on the wafer (W) may be eased by the buffer ring 110 and a curved surface can be well sealed by the metal-containing layer patterns 60. Thus, the electrolyte 112 may be supplied so as to occupy only a fixed area. The pressure is measured by the pressure sensor 38, so the electrolyte supply external pipe 101 may be controlled so that the electrolyte supply external pipe 101 does not excessively press the wafer (W). The first electrode 102 may be disposed to be adjacent onto the conductive layer 114. After the height and the location of the electrolyte supply external pipe 101 are determined, the electrolyte 112 is supplied through the internal minute pipe 108. As the electrolyte supply external pipe 101 is disposed to be adjacent to a lower end portion of the electrolyte supply external pipe 101, the electrolyte 112 may fill the electrolyte supply external pipe 101 from a bottom to a predetermined height without a bubble. A negative pressure is pressed on the internal minute pipe 108 supplying the electrolyte 112, so that the electrolyte 112 may be prevented from spreading to the outside or excessively flowing over. After the electrolyte 112 is supplied, fixed voltages and fixed currents are applied to the first electrode 102 and the second electrode 104 respectively by the potentiostat 20 and the electric resistance between the first and second electrodes 102 and 104 is measured as impedance value of a complex number type. The measured electric resistance is represented by the displayer 52 and stored in the CPU 50.

The amount of residuals can be quantified by in-line method without dividing a wafer by embodying the wafer test apparatus 100.

The wafer test apparatus 100 described with reference to FIGS. 7 through 15 includes the adhesive supply unit 40 and the dry chamber 26 for forming the conductive layer 114 described with reference to FIG. 2. However, as described with reference to FIG. 3, if the first electrode 102b has a shape of an edge of a knife having a sharp end portion, the adhesive supply unit 40 and the dry chamber 26 are not needed. In this case, the shape of the first electrode 102b may be changed into the shape of an edge of a knife having a sharp end portion without the adhesive supply unit 40 and the dry chamber 26. The shape of the first electrode 102b is equal to FIG. 2, but it may further include an auxiliary means applying a force which can pass by the insulating pattern 62 so that a rod having a shape of an edge of a knife having a sharp end portion and the sharp end portion of the rod are adjacent to the metal-containing layer pattern 60.

A wafer test method according to an embodiment of the inventive concept can recognize the amount of residuals generated in a sidewall of the metal-containing layer pattern and the extent of corrosion of a sidewall of the metal-containing layer pattern using the measured electric resistance by supplying an electrolyte so that the electrolyte is in contact with a portion of the metal-containing layer pattern in a predetermined chip region and measuring an electric resistance between a first electrode which is electrically in contact with the other portion of the metal-containing layer pattern and a second electrode which is in contact with the electrolyte in the predetermined region. That is, the amount of residuals, the extent of corrosion and a distribution of a sidewall of the metal-containing layer pattern may be quantified as an electric resistance. Thus, a wafer test method can be embodied by an in-line method without dividing a wafer into each chip.

A wafer test apparatus according to another embodiment of the inventive concept may include a wafer receiving portion in which a wafer including a plurality of chip regions including a metal-containing layer pattern is received, a first electrode electrically connected to a portion of the metal-containing layer pattern, an electrolyte supply unit supplying an electrolyte which is in contact with the other portion of the metal-containing layer pattern in a predetermined region on a wafer, a second electrode which is in contact with the electrolyte and a potentiostat which applies a specific current and a specific voltage to the first electrode and the second electrode to measure an electric resistance to recognize the amount of residuals or the extent of corrosion of a sidewall of the metal-containing layer pattern. Thus, the wafer test apparatus in accordance with another embodiment can test a wafer using an in-line method without dividing a wafer into each chip.

Having described the exemplary embodiments of the inventive concept, it is further noted that it is readily apparent to those of reasonable skill in the art that various modifications may be made without departing from the spirit and scope of the inventive concept which is defined by the metes and bounds of the appended claims.

What is claimed is:

1. A wafer test method comprising:
    preparing a wafer including a chip region on which a metal-containing layer pattern having a first portion and a second portion is formed;
    supplying an electrolyte so that the electrolyte is in contact with the first portion of the metal-containing layer pattern in the chip region; and
    measuring an electrical resistance between a first electrode electrically connected to the second portion of the metal-containing layer pattern in the chip region and a second electrode which is in contact with the electrolyte.

2. The method of claim 1, wherein before supplying the electrolyte, further comprising forming a conductive layer which is in contact with the second portion of the metal-containing layer pattern, and wherein the first electrode is in contact with the conductive layer.

3. The method of claim 2, wherein the forming of the conductive layer comprises:
    coating a conductive adhesive so that the conductive adhesive is in contact with the metal-containing layer pattern; and
    drying the conductive adhesive to form the conductive layer.

4. The method of claim 1, wherein the electric resistance is represented as an impedance of a complex number.

5. The method of claim 1, wherein an area which the electrolyte occupies in the chip region is constant regardless of a position of the chip region.

* * * * *